United States Patent [19]
Dreyfus et al.

[11] 3,997,839
[45] Dec. 14, 1976

[54] ELECTROMETER

[75] Inventors: Gerard Dreyfus, Villebon-sur-Yvette; Jacques Lewiner, Saint-Cloud, both of France

[73] Assignee: Agence Nationale de Valorisation de la Recherche, Paris, France

[22] Filed: Nov. 25, 1974

[21] Appl. No.: 526,733

[30] Foreign Application Priority Data

Nov. 23, 1973   France .................. 73.41853

[52] U.S. Cl. .................. 324/109; 324/32; 324/72.5
[51] Int. Cl.$^2$ .................. G01R 5/28; G01R 29/12
[58] Field of Search .......... 324/109, 32, 72.5, 118, 324/72; 330/61; 355/3, 14, 15

[56] References Cited

UNITED STATES PATENTS

| | | | |
|---|---|---|---|
| 3,195,037 | 7/1965 | Van Nie | 324/109 |
| 3,256,481 | 6/1966 | Pulvari | 324/109 |
| 3,504,281 | 3/1970 | Cromer et al. | 324/109 |

Primary Examiner—R. V. Rolinec
Assistant Examiner—Ernest F. Karlsen
Attorney, Agent, or Firm—Larson, Taylor and Hinds

[57] ABSTRACT

The device measures electrical charges, an electrical voltage or an electrical current, present between two electrodes of which one is fixed and of which the other is mounted so as to be able to vibrate mechanically. One of the two electrodes is connected to ground. Energizing means apply an AC voltage $V_o$ of frequency $f_o$ between the two electrodes. Means are provided for detecting the amplitude of the mechanical vibrations of frequency $f_o$ of the vibrating electrode and means for measuring this amplitude, which is a function of the parameter to be measured. The means for detecting and measuring the amplitude of the mechanical vibrations is a piezo-electric element subject to these vibrations and an apparatus adapted to measure the AC voltage produced.

25 Claims, 8 Drawing Figures

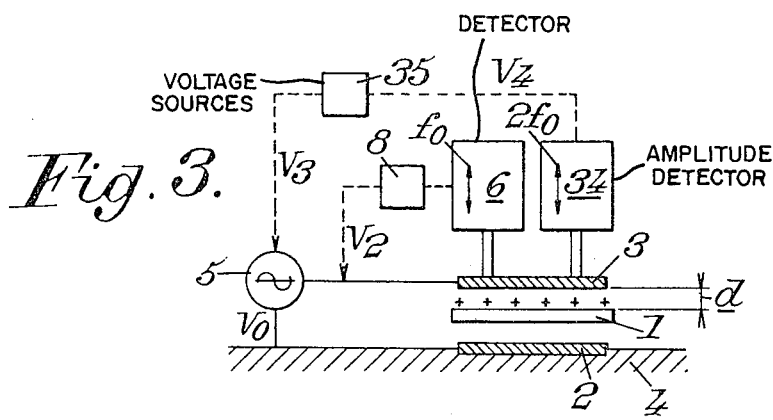
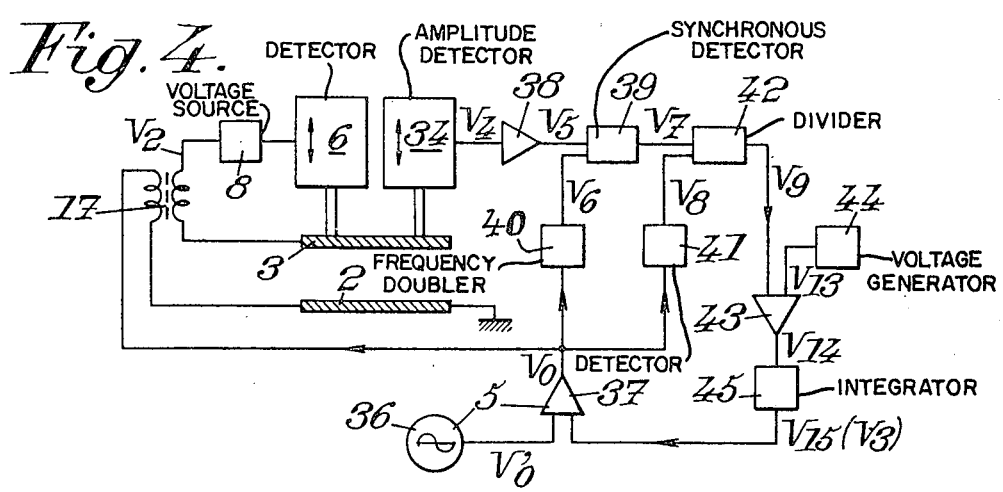
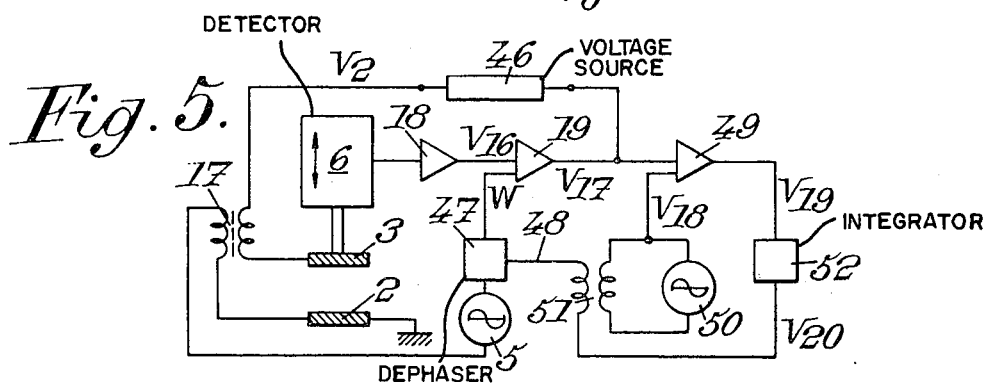
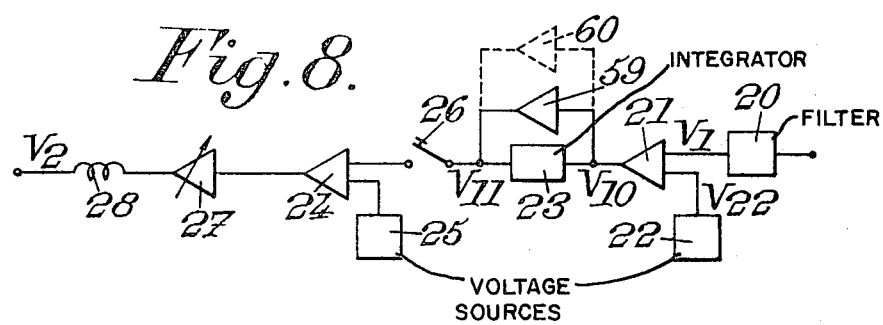

ELECTROMETER

The invention relates to electrometers, that is to say to devices for measuring quantities of electrical charges or of other parameters, such as electrical voltages or electrical currents, whose measurement can be related to that of such a quantity of charges.

It relates more particularly, but not exclusively, to those of these devices, enabling the measurement of surface densities of electrical charges comprised between $5.10^{-10}$ and $5.10^{-6}$ Coulombs/cm2, electrical voltages comprised between $-2500$ and $+2500$ V and electrical currents comprised between $10^{-17}$ and $10^{-5}$ A.

It should be understood that, by the expression "measurement", is included in the present description both a measurement proper manifested by the display of a numerical indication or the like on a suitable apparatus, with or without recording, and to the determination of a quantity immediately used, without special display, for the purposes of warning, of automatic correction or the like.

The invention relates more particularly, among the devices of the type concerned, to those for which the amount of electrical charges (or more generally the electrical parameter to be measured which can be likened to such a quantity of charges) is present (or manifest itself) between two electrodes of which one is fixed and of which the other is mounted in such a way as to be able to vibrate mechanically.

It will be recalled that, in known devices of this type, called "vibrating condensor type", the electrode free to vibrate is subjected to mechanical vibration, which modulates to the frequency itself of these vibrations the quantity of electrical charges created on this electrode by the source of charges to be studied, and this with an amplitude which is directly dependent on the quantity of electrical charges contained in this source; it is the amplitude of this modulation which is then measured by the electrical means.

These known devices have certain drawbacks, in particular due to the fact of the upper limitations imposed, for mechanical reasons, respectively at the frequency and at the amplitude of the mechanical vibrations applied to the vibrating electrode:

the first limitation is manifested by considerable response times of the servocoupling circuits or feedback loops possibly energized by the signals detected, these times being able to reach a second for frequencies of vibration of the order of 200 to 400 Hz, the second limitation is prejudicial to the sensitivity of the measurement, since the latter increases with the amplitude of the vibration.

It is a particular object of the invention to overcome these drawbacks by enabling at the same time high response speeds of the servocoupling circuits possibly provided and a high sensitivity of the measurement.

The measurement devices according to the invention comprise means for applying to one of the electrodes a reference electrical voltage, notably by placing this electrode to ground, and they are essentially characterised in that they comprise in addition: energizing means for applying an alternating electrical voltage $V_o$ of frequency $f_o$, between the two electrodes; means for detecting the amplitude of the mechanical vibrations of frequency $f_o$ of the vibrating electrode; and means for measuring this amplitude, which is a function of the parameter to be measured (quantity of electrical charges, voltage or electric current).

In preferred embodiments, recourse is had besides to one and/or other of the following features:

on one hand means for detecting the amplitude of the mechanical vibrations are arranged so as to form an electrical voltage whose amplitude is a function of this amplitude and of which the frequency is equal to that of the energizing voltage and on the other hand the measuring means of the amplitude comprise means for applying to the vibrating electrode an adjustable part of a DC electrical voltage formed from said electrical voltage so as to cancel the electrical charge of this electrode (or to give it any preset desirable value) and thus to cancel its mechanical vibrations, means for detecting the moment of this latter cancellation and means for measuring the value of said electrical voltage at this moment, to compensate for the errors due to variations in the distance between the measurement electrode and the bearing surface of the charges to be measured, electrometers of the type concerned are made to include: means for detecting the amplitude of the mechanical vibrations of frequency $2f_o$ of the vibrating electrode; means for forming a DC electrical voltage $V_3$ whose amplitude is a function of this amplitude; and means for applying this voltage $V_3$ to the energizing means so as to modify the amplitude of the voltage $V_o$ in the sense which tends to render the amplitude of the abovesaid mechanical vibrations of frequency $f_o$ independent of the distance between the vibrating electrode and the support of the charges, regarding an electrometer according to which means for measuring the amplitude of the electrical voltage formed by the means for detecting the amplitude of the mechanical vibrations comprise a synchronous detector receiving on the one hand the electrical measuring voltage and on the other hand the energizing voltage $V_o$, such an electrometer is made to include means for maintaining the phase shift constantly zero between these two voltages at the level of said synchronous detector.

The invention comprises, apart from these main features, certain other features which are preferably used at the same time and which will be more explicitly discussed below.

In the following there will be described some preferred embodiments of the invention with reference to the accompanying drawings made of course in purely non-limiting manner.

FIG. 1 of these drawings is a highly simplified diagram of an electrometer constructed according to the invention.

FIG. 3 is a highly simplified diagram of another electrometer applying an improvement of the invention.

FIG. 4 is a fuller diagram of a preferred embodiment of this electrometer.

FIGS. 5, 6 and 7 are diagrams of respectively three other embodiments of electrometers applying another improvement of the invention.

And FIG. 8 is a diagram of another embodiment of an electrometer applying again another feature of the invention.

Figure 1:
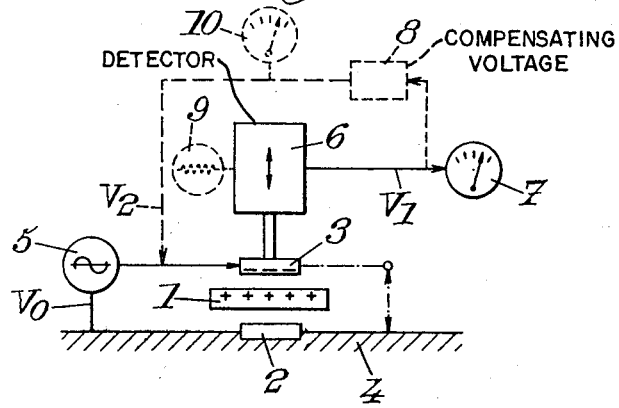

In the diagram of FIG. 1 there is shown at 1 an element, such as a sheet or thin dielectric plate, charged electrically, inserted between a fixed electrode 2 and a movable electrode 3 mounted so as to be able to vibrate mechanically.

The element 1 is constituted of a material of low electrical conductivity: it is for example a sheet coated with a photoconducting layer, before or after an illumination adapted to modify its local characteristics, or a film of plastics material, a synthetic fabric, an electret, a piezoelectric or pyroelectric element, or a support for electrophotographic or electroreprographic images, or again any support (tape, disc or the like) for recorded data in the form of particular distributions of electrical charges for the storage of these data in suitable memories or their reproduction, and notably acoustical or optical. In the latter case, the measuring electrode 3 may be considered as playing the role of a read-out head of the "electrical" type.

In the case where it is desired to measure a current or an electrical voltage and no longer a charge borne by a weakly conducting specimen, this variable electric voltage can be applied directly to one of the electrodes or between the two electrodes.

In the example illustrated in FIG. 1, the upper surface of the sheet 1 is charged positively and the vibrating electrode 3, arranged just above this sheet, has on its lower surface negative charges created by said sheet.

One of the two electrodes — here the fixed electrode 2 — is fixed to a reference source of DC electric voltage, notably to ground 4.

In addition between the two electrodes 2 and 3 an alternating voltage $V_o$ of frequency $f_o$ — comprised preferably between 100 Hz and 10 MHz — emitted by a suitable source 5, such as an oscillator, is applied.

It is known that in the absence of any electrical charge between the electrodes 2 and 3, said voltage $V_o$ generates at the electrode 3 mechanical vibrations of frequency $f_o$.

However if a charge exists between these electrodes, this charge manifests its existence by superposing on said vibration an additional vibration of frequency $f_o$ whose amplitude is directly connected with said charge.

It is this additional vibration which is detected and measured, according to the invention, in order to deduce therefrom the value of the electric charge which gave rise to it.

To this end there is provided:
means 6 for detecting the amplitude of the vibratory component, of frequency $f_o$, of the vibrations of the electrode 3, means generally adapted to convert this component into an electrical voltage $V_1$ of the same frequency $f_o$ and of amplitude proportional to that of said component, and means 7 for measuring the amplitude of this voltage $V_1$, which amplitude is directly related to the quantity of charges to be measured.

According to a particularly advantageous modification, a zeroing method is used.

According to this method, between the electrodes 2 and 3 a direct voltage $V_2$ of adjustable value, formed at 8 from the voltage $V_1$ (notably in one of the ways which will be specified below) is applied so as to cancel the mechanical vibrations of frequency $f_o$ which have given rise to this voltage $V_1$.

When this cancellation is achieved — which phenomenon can be observed by means of a suitable apparatus 9 such as an oscilloscope — the value of the voltage $V_2$ at this moment, which value is directly connected to the quantity of the charges to be measured, is measured on an apparatus 10.

This zeroing method has the following considerable advantage with respect to previously known methods, and even with respect to the above-described method using simply an absolute measurement without a servocoupling chain:

in prior methods, it is very difficult to avoid production of sparks between the charged specimen 1 and the measuring electrode 3, which not only disturbs the measurement of the charges borne by said electrode, but furthermore does not respect the integrity of said sample with respect to said charges;

on the other hand, when, according to the specified zeroing method according to the invention, the DC compensating voltage $V_2$ applied to the electrode 3 has a value such that it cancels the amplitude of the vibration of the latter, the DC electrical field created between the said electrode and the facing surface of the specimen 1 is annuled, which eliminates any risk of sparks between these two elements and any risk that the measurement may disturb and modify the amount of the charge to be measured.

Figure 2:
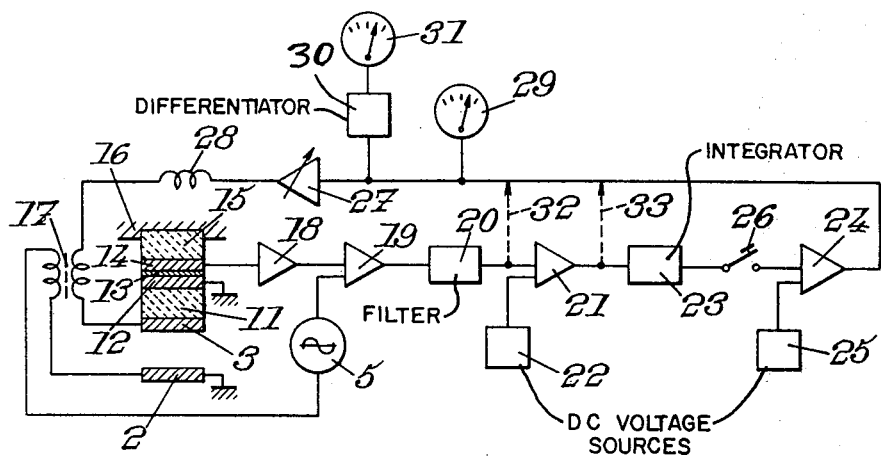
FIG. 2 is a more complete diagram of a preferred embodiment of this electrometer.

Referring to FIG. 2, there will now be described in more detail a preferred embodiment of the invention.

Each of the electrodes 2 and 3 has here the form of a metallic electrically conducting circular disc.

The electrode 3 is attached rigidly to a mechanical vibration detector comprising, stucked upon one another:

a first electrically insulating rigid body 11 notably of alumina, a first electrically conductive plate or armature 12, a piezoelectric or crystal plate 13 of quartz or any other suitable substance, a second electrically conducting plate or armature 14, and a second electrically insulating body 15, notably of alumina itself fixed in a support 16.

These various elements are assembled against one another by means of hardened layers of glue, those of these layers which are interposed between the crystal plate 13 and the armatures 12 and 14 being electrically conducting.

The sizes of these various elements are selected to that the mechanical resonance frequency of the assembly is equal to the frequency $f_o$.

Generally the diameter of the disc 3 is selected to be between 0.9 and 110 mm.

Of course, various modifications of the above detector stack may be envisaged: in particular the electrode 3 can be constituted by simple metalisation of the piezoelectric element 13; in the same way this electrode can have the form of a cone or of a pin fixed on said element: the end of such a pin may have a diameter as small as 0.5 microns, which permits excellent spatial resolution of the device.

The source 5 of alternating voltage $V_o$ of frequency $f_o$ is here an oscillator connected to the electrode 3 through an isolating transformer 17.

The first armature 12 is grounded.

The second armature 14 then collects an alternating electric voltage whose amplitude is proportional to the amplitude of the mechanical vibrations imposed on the plate 13, that is to say at the electrode 3, and whose frequency is equal to that of these mechanical vibrations.

Said armature 14 is successively connected:
to a selective amplifier 18 whose band pass is centred at the frequency $f_o$, to a synchronous detector 19 which receives on the one hand the output voltage from the amplifier 18 and on the other hand a part of the voltage $V_o$ generated by the oscillator 5, this detector comprising means adapted to shift the phase of one of these two voltages with respect to the other, and a filter 20 adapted to extract the DC component from the signal delivered by the detector 19.

This DC component is a voltage $V_1$ of which the amplitude is proportional to that of the mechanical vibrations of frequency $f_o$ of the electrode 3 and of which the sign is related to that of the electrical charges borne by this electrode.

By "synchronous detector", here and through out the present description, is meant an assembly comprising not only a synchronous detector apparatus proper, but also integration means of the output voltage from this apparatus adapted to supply a DC voltage whose value is afunctionof the amplitude of said output voltage.

The synchronous detector 19 permits on the one hand improvement in the signal-noise ratio corresponding to the useful component $V_1$ thus extracted and on the other hand knowledge of the sign of this component due to the comparison rendered possible between the voltage emerging from the selective amplifier 18 and the energizing voltage $V_o$.

This voltage $V_1$ is then delivered to one of the inputs of a differential amplifier or adder 21 of which the other input is polarised by the DC voltage $V_{22}$ formed by a DC voltage source 22.

This amplifier 21 enables regulation of the level of the voltage collected by adding to it or detracting therefrom at will another DC voltage of predetermined value.

The output $V_{10}$ from this amplifier 21 is sent into an integrator device 23 whose output voltage $V_{11}$ is proportional to the integral of the voltage $V_{10}$ with respect to the time from the beginning of each measurement cycle upto the moment concerned.

The role of this integrator is to avoid the servocoupling or recycling described succintly above in order to be able to utilize the device according to a zeroing method being too transitory: in fact, theoretically, when by means of the servocoupling circuit concerned, the cancellation of the useful mechanical vibration of the electrode 3 is obtained, the voltages $V_1$ and $V_2$, which are "images" of this vibration, are also cancelled, as well therefor as the compensation that they generate; the integrator enables the phenomenon to be preserved during cycles of sufficient length for it to be utilized in practice.

The output voltage $V_{11}$ from the integrator is sent to one of the two inputs of a second differential amplifier or adder 24 whose other input is polarised by an adjustable DC voltage source 25.

This second amplifier 24 enables adjustment of the DC voltage applied between the two electrodes 2 and 3, at the beginning of measurement, after possible opening of a switch 26 inserted between the integrator 23 and the corresponding input of this second amplifier 24.

The output $V_{12}$ from this amplifier 24 is converted into the compensating voltage $V_2$ above by passing through a second amplifier 27 of adjustable gain G and a choke coil 28.

It is this voltage $V_2$ which is reinjected at electrode 3 thus closing the servocoupling circuit or feedback loop which permits the device to operate according to a zeroing method.

In the diagram of FIG. 2, there is provided in addition:

a measuring apparatus 29, such as a voltmeter, adapted to indicate the value of the voltage $V_{12}$, a differentiator 30 adapted to form the derivative of this voltage $V_{12}$, which derivative is proportional to the corresponding current, this differentiator being associated with a measuring apparatus 31 of the voltmeter type.

It is of course possible to connect these measuring apparatuses 29 to 31 directly to any other desirable point of the circuit, for example:

to the output of the filter 20 (which is shown symbolically by the connection in interrupted lines 32), the sequence of elements 21 to 28 of the circuit then being eliminated and the apparatus 29 then playing the role of the apparatus 7 above, to the output from the differential amplifier or adder 21 (which is shown symbolically by the connection in interrupted lines 33), or again to the output from the last amplifier 27.

The latter solution, not shown, has the drawback of bringing a relatively strong current into play. However it enables the use of a non-linear amplifier 27 although, if the measuring apparatuses are provided in the circuit upstream of this amplifier, their readings are only directly usable with a linear amplifier 27.

It is to be noted that the measuring apparatus 29 or that (not shown) which serves for measuring the output from the amplifier 27 plays the role of the measuring apparatus which has been denoted by the reference No. 10 in FIG. 1.

The servocoupling or recycling which has just been described enables the measurement of the amount of electric charges present on the electrode 3, and hence the DC voltage applied to the vibrating capacitor (2, 3), to be brought back to the measurement of the DC compensating voltage $V_2$ (or of a voltage $V_{12}$ which is connected with the latter) generated when the vibrations of frequency $f_o$ of the electrode 3 are cancelled.

In other words knowledge of this voltage $V_2$ enables knowledge of the electrical charge density present in the sample 1.

This knowledge also enables the following parameters to be known, whose measurement is brought back to that of such a charge density: electrical voltage of a source connected between the electrodes 2 and 3, electric current flowing in the sample 1, electric current flowing between the electrodes 2 and 3 from a source mounted in series with the vibrating capacitor.

The choice of DC voltage $V_{22}$ above enables the point of operation of the device to be fixed: thus, if this voltage $V_{22}$ is nil, the servocoupling loop concerned enables cancellation of the mechanical vibrations of the electrode 3 when the electric field in the vicinity of this electrode is nil; on the other hand, if the voltage $V_{22}$ is not nil, the mechanical vibrations of the electrode 3 are cancelled when in its neighbourhood an electric field H exists whose known zero value depends on the value of the said voltage $V_{22}$. Under these conditions, it is possible to form permanently the electrical voltage $V_2$ adapted to cancel the mechanical vibrations of the electrode 3 under a constant electrical field which is not necessary zero. This characteristic is very advantageous for certain applications, for example to study the movements of electrical charges in materials having a high electrical resistance (semi-conductors, insulators ...), or again to cancel the interfering electric fields created between the electrodes, for example by reason of the differences between the contact potentials of the constituent metals of the two electrodes.

To complete the foregoing, there are given below some specifications as regards the different voltages to be applied and measured in the various cases.

In a general way, the amplitude A of the mechanical vibration of the electrode 3 is given by the formula $$A = Bv_o (E_o - V_2) \qquad (1),$$

in which:

B is a constant depending on the dialectric constant of the sample 1, on its thickness, of the thickness of the capacitor and on the dielectric permittivities of the media in which the two electrodes occur, $V_o$ is the amplitude of the energizing alternating voltage $V_o$, $V_2$ is the amplitude of the DC compensating voltage $V_2$, and $E_o$ is a DC voltage, called the "equivalent voltage" of the same 1, which depends on the density of the electric charges borne by this sample and on its thickness.

If the electrical charge density of the specimen 1 for unit surface, on the surface of this specimen which is facing the electrode 3 is called $s$, and if the fixed electrode 2 is juxtaposed against the other surface of said specimen, the relation obtained is:

$$E_o = -Cs \qquad (2)$$

in which C is a constant depending on the thickness and the dielectric constant of the specimen.

As a result:

$$A = Bv_o (-Cs - V_2) \qquad (3)$$

If therefore the constance B and C and the amplitude $V_o$ are known, and if it is possible to determine with accuracy the value of the amplitude A, both as regards its magnitude and its sign, it is unnecessary to apply a compensating voltage $V_2$ to know the density $s$; in fact, if $V_2 = O$ is introduced into the relationship (3), one has:

$$A = BC v_o s$$

If however A is not known exactly, but only a magnitude proportional to this amplitude, it suffices to apply the compensating voltage $V_2$ until the amplitude A is cancelled, in view of the fact that at this instant one has necessarily $V_2 = -Cs$, which permits $s$ to be again determined.

The latter measurement is that which has been denoted above by the expression zeroing method.

It is possible to demonstrate in addition that, if the specimen 1 is, inspite of its high resistivity, traversed by a weak electric current due to the migration of the charges in this specimen, the average current in the latter is given by the expression:

$$J = D \left( \frac{\delta V_2}{\delta t} \right)_A$$

in which expression

D is a constant dependent on the dielectric constant of the specimen and on the surface of the latter disposed facing the smallest electrode, $$- \left( \frac{\delta V_2}{\delta t} \right)_A$$

is the partial derivative of the voltage $V_2$ with respect to time when the amplitude A of vibration of the electrode 3 is kept constant, that is to say if the average charge density present on this electrode is kept constant.

The latter method of measurement has the following remarkable property: it enables the measurement of a very weak DC electric current in a specimen without any DC electric current passing in the connected wires from this specimen to the measuring apparatus, more particularly when operating at high voltage or at high temperature, in which conditions the leakage currents in the wires can then become as large as the current itself to be measured, and in which the usual methods can only measure the sum of these currents.

Lastly, if it is desired to measure a voltage, coming from a high impedance source, applied to the terminals of the electrodes 2 and 3, it suffices to measure as above the voltage $V_2$ which it is necessary to oppose this unknown voltage to cancel the electric charge borne by the electrode 3, which cancellation is again detected by observing the cancellation of the mechanical vibrations of this electrode.

Purely by way of indication, it is pointed out that the voltage $v_o$ above is generally comprised between 3 and 300 volts and that the gain G above can have any value compatible with the stability of the system and can be for example of the order of 1000.

In the following there will be described several still further improved modifications of the above electrometers.

In the preceding electrometers the amplitude of the electrical voltage delivered by the mechanical vibrations detector 6 depends not only on the electrical charge density borne by the specimen 1 and on the amplitude of the voltage $V_o$, but again on the distance $d$ between the movable electrode 3 and the facing surface of said specimen 1.

This distance $d$ must hence be maintained constant in the course of th measurement if the latter is not to be false.

An improvement according to the invention enables this distance to be vaired without disturbing the measurement between two limits relatively distant from one another, both comprised for example between a micron and 2 centimeters, for example respectively equal to 100 microns and 3 mm.

To this end there are provided:

a device 34 (FIG. 3) connected to the electrode 3 and adapted to detect the amplitude of the mechanical vibrations of frequency $2f_o$ of this electrode 3 in forming an alternating electrical voltage $V_4$ of frequency $2f_o$ whose amplitude is proportional to said amplitude, means 35 for forming a DC electric voltage $V_3$ proportional to the ratio of the amplitudes of the voltages $V_4$ and $V_o$, and means for applying this voltage $V_3$ to the source 5 so as to modify the amplitude of the voltage $V_o$ in the sense which tends to render the amplitude of the mechanical vibrations of frequency $f_o$ of the electrode 3 independant of the distance $d$ between this electrode and this specimen 1.

This application is advantageously carried out by applying said voltage $V_3$ to a voltage multiplier supplied by the source 5 above, the energizing voltage $V_o$ applied to the electrode 3 then being no longer exactly that directly emerging from said source, but the latter corrected automatically by the voltage $V_3$ so that its amplitude increases if the distance $d$ increases and on the other hand diminishes if the distance $d$ diminishes.

Referring to FIG. 4, there will now be described in more detail below a preferred embodiment of this improvement.

The source of alternating voltage 5 comprises an oscillator 36 tuned to frequency $f_o$ and a multiplier 37 supplied by the output from the oscillator 36, of which multiplier the output $V_o$ is applied to the movable electrode 3 through an isolating transformer 17.

The DC voltage $V_4$ produced by the detector 34 of the vibrations of frequency $2f_o$ is applied to the input of a selective amplifier 38 whose band pass is centered at the frequency $2f_o$.

The output voltage $V_5$ from this selective amplifier is applied to the input of a synchonus detector 39 which provides a DC signal $V_7$ proportional to the amplitude of the vibrations of frequency $2f_o$, the reference signal $V_6$ of this synchronous detector being supplied by a frequency doubler 40 to which a part of the voltage $V_o$ above is applied.

A third part of the voltage $V_o$ is applied to the input of a detector 41 which provides a DC signal $V_8$ proportional to the amplitude of said voltage $V_o$.

The DC voltage $V_7$ coming from the synchronous detector 39 and the DC voltage $V_8$ coming from the detector 41 are applied to the inputs of a divider 42 which supplies a voltage $V_9$ proportional to the ratio of the aplitudes of the voltages $V_o$ and $V_4$.

This output voltage $V_9$ from the divider 42 is applied to one input of a differential amplifier 43 to the other input of which is applied a DC voltage $V_{13}$ coming from a DC voltage generator 44. This voltage $V_{13}$ is selected so that, for a preferred given value of the distance $d$, an optimum value of the gain of the servocoupling loop 3-6-8-3 above is obtained, which gain depends exclusively on that of the capacitor 1-2-3, the only variable in this loop.

The voltage $V_{14}$ coming from the differential amplifier 43 is indicated by an integrator 45 of which the output voltage $V_{15}$ is applied to the second input of the multiplier 37 above.

This voltage $V_{15}$ is none other than the voltage $V_3$ which was discussed above.

Instead of this voltage $V_{15}$, it would be possible to use as compensating voltage for the distance $d$ any other voltage formed at an intermediate point of the servocoupling loop concerned on condition that this voltage is a bearer of the data "distance $d$": this is for example the case, under certain conditions, of the voltages $V_7$ and $V_9$ above.

In certain applications, such as those for which the electrode 3 plays the role of a read-out head, it may be advantageous to utilize the compensating voltage concerned, bearing the data distance $d$, in order to correct quasiinstantaneously the position of said electrode 3 so as to keep the distance $d$ concerned constant, by actuating in consequence with said voltage quasi-instantaneous movements of this electrode.

If the amplitudes of the mechanical vibrations of the electrode 3 at frequencies $f_o$ and $2f_o$ are called respectively A and A', and denote the amplitude of the AC energizing voltage $V_o$, it can be said that, in accordance with the present improvement, it is sought to render the amplitude A independent of the distance $d$ and that to this end the quantity $A'/v_o$ is rendered independent of $d$ by modifying $v_o$ as a function of the variations of A' due to those of $d$: the desired result is achieved due to the fact that the said quantity is proportional to the amplitude A.

The vibration detector 34 may be constituted in the same way as the detector 6.

In particular it is possible for it to be constituted from one or several piezoelectric elements, from a capacitive detector of the electrostatic condenser type polarised by a DC voltage or by an electret, by an optical device adapted to utilize the variations in direction or in length of a light beam reflected on a mirror connected mechanically to the vibrating electrode, or again an electrodynamic or magnetic vibration detector.

If necessary the two detecters 6 and 34 may be combined into a single one.

There will now be described another improvement provided by the invention in the above electrometers.

In the embodiment of the servocoupling loop 3-6-8-3 described above with reference to FIG. 2, said loop comprises a synchronous detector 19 whose output voltage $V_{17}$ is proportional:

to the amplitude of the AC voltage $V_{15}$ formed by the detector 6 and by passing through a selective amplifier 18 of a band pass centered at frequency $f_0$, to the amplitude of a part of the AC voltage $V_0$ serving as reference voltage, and to the cosine of the phase shift between these two voltages $V_0$ and $V_{16}$.

This synchronous detector 19 comprises means for dephasing the two said voltages with respect to one another and preferably to give their phase shift a value of 0° so that the absolute value of the cosine of said phase shift is equal to one, which, all things being otherwise equal, renders the absolute value of the signal emerging from said detector a maximum.

However if this phase shift becomes variable in the course of time, there is risk of a systematic error being introduced into the measurement; such accidental variations in the phase shift may be due to a modification of the resonance frequency of the detector 6 if the latter is of the resonant type, which modification is due for example to a changing temperature or to deformation resulting from a shock; these accidental variations may be due also to a modification of one of the characteristics of the phase shift device contained in the synchronous detector, or again to a modification of the frequency $f_0$ of the energizing voltage, these two latter modifications being a possible result of the aging of the constituent components.

In the same way if the detector 6 is selected from among several detecters of the mass-produced resonant type, of which detectors the resonance frequencies are not strictly the same, it is necessary to regulate the general tuning of the whole after replacement of such a detecter.

In applications requiring high accuracy, or in order to permit easy exchange of mass-produced detecters, and hence not necessarily tuned with precision to the frequency $f_0$, it is desirable that the accidental phase shift concerned should be automatically compensated.

The present improvement has the purpose of ensuring this automatic compensation by automatically equalizing to 0° the phase shift which exists between the two voltages $V_0$ and $V_{16}$ applied to the synchronous detector 19, so as to render a maximum in absolute value the signal coming from this detecter.

Figure 6:
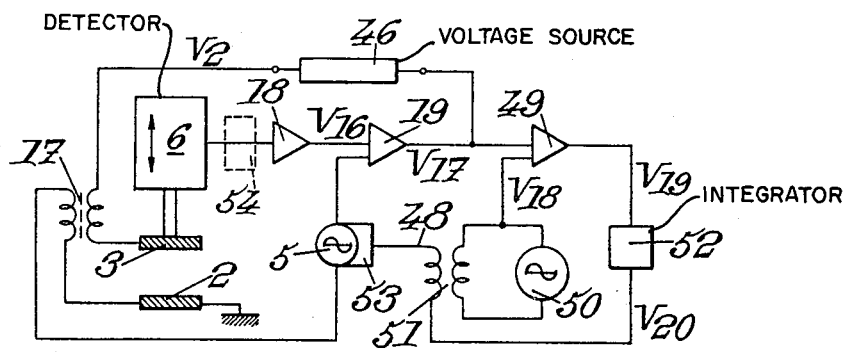
Figure 7:
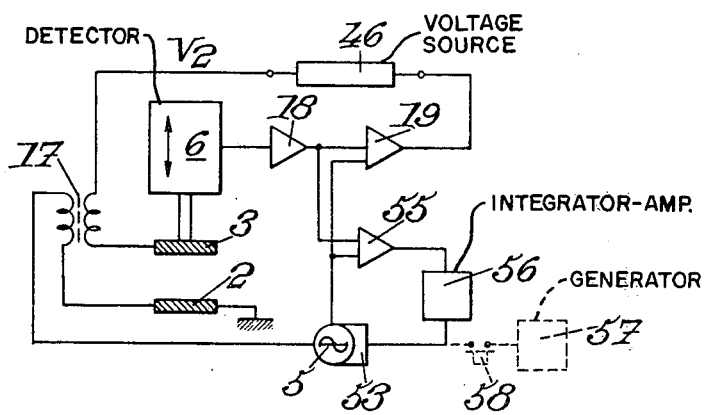

Referring to FIGS. 5 to 7 there will now be described three preferred embodiments of this improvement.

In each of these three figures the rectangle 46 represents the assembly of the electronic members, of the servocoupling loop 3-6-8-3, situated between the output of the synchronous detector 19 and the electrode 3 (members numbered from 20 to 28 above).

In the embodiment of FIG. 5, there is inserted between the source 5 and the synchronous detector 19 a dephaser 47 adapted to introduce a phase shift as a function of the voltage which is applied to it by a wire 48 in the way which will be indicated below.

The output signal from the synchronous detector 19 is applied on the one hand to the assembly 46 adapted to form the voltage $V_2$, and on the other hand to an auxiliary or correcting synchronous detector 49.

The reference signal from this synchronous correcting detector 49 is formed by a generater device 50 of an AC voltage $V_{18}$ of frequency $f_1$ at least equal to $f_0/5$.

This voltage $V_{18}$ is also applied through a transformer 51 and the wire 48 above, to the dephaser 47.

The output signal $V_{19}$ from the synchronous correcting detector 49 is applied to an integrater 52 whose output voltage $V_{20}$ is that applied to the dephaser 47 by the wire 48.

The correcting loop thus constituted by the members 47 to 52 ensures the desired automatic phase shift correction at the level of the synchronous detector 19: in fact the voltage W coming from the dephaser 47 is periodically dephased (at frequency $f_1$) with respect to the input $V_0$ of this dephaser. The output signal $V_{17}$ from the synchronous detector 19 is then modulated at frequency $f_1$ when the phase shift between the two voltages $V_{16}$ and W applied to this detector is not zero, that is to say is positive or negative, the phases of this signal $V_{17}$ which correspond respectively to these two signs of phase shift differing from one another by 180°. On the other hand if the phase shift concerned between the two voltages $V_{16}$ and W is nil or very slight and if the amplitude of phase modulation at frequency $f_1$ is sufficiently small, the component, modulated to this frequency $f_1$, of the voltage $V_{17}$, is nil or practically nil.

The synchronous correcting detector 49, which receives as reference voltage the voltage $V_{18}$ at frequency $f_1$ only detects this component modulated at frequency $f_1$ of the signal $V_{17}$: it hence supplies the dephaser 47 with the error signal necessary for the desired correction.

In FIG. 6 there is shown diagrammatically a modification of this assembly according to which the dephaser 47 is replaced by a device 53 adapted to modify slightly the frequency of the oscillater 5: it is then this device 53 which receives correcting signal formed as previously and applied through the wire 48.

The necessary phase shift between the two voltages applied to the synchronous detector 19 is then created by a device 54 adapted to cause the phase of the electric measuring signal coming from the detecter 6, to be varied, when the frequency of this signal varies.

This device 54 may be eliminated when the vibration detector 6 is of a resonant type, its role then being ensured by this detecter itself and by the correction loop described. In the latter case, it is preferable to replace the selective amplifier 18 by an amplifier with a wide band pass.

In FIG. 7 there is shown diagrammatically another modification of the two preceding assemblies, applicable again to a measurement device utilizing a detecter 6 of the resonant type.

If such a detecter 6 is used, it is necessary to render the frequency of the oscillator 5 constantly and strictly equal to the resonance frequency of this detecter.

To this end a supplementary synchronous detector 55 is used phase shifted by 90° with respect to the synchronous detector 19, that is to say supplied by the same voltages as the latter detecter and adapted to deliver an error signal which is nil when the signal coming from the detecter 19 is a maximum, and on the other hand all the higher as the latter signal departs from its maximum value.

The error signal is applied through an assembly 56 to a corrective device 53 of the type in FIG. 6, that is to say adapted to correct the frequency of the oscillater 5.

This correction is all the greater as the error signal is itself greater: the desired correction is thus very simply ensured.

The assembly 56 is advantageously constituted by an integrator on which is mounted in parallel a differential amplifier and/or a DC amplifier.

The correction loop thus formed only operates if the error signal is sufficiently small, hence if the frequencies to be brought together are sufficiently near: to start up said loop it may be opportune to introduce into the corrector device 53 a saw tooth or sinusoidal voltage derived from a suitable generator 57, which voltage is adapted to cause the voltage coming from the oscillator 5 to be swept by frequency through the whole range of frequencies capable of being equalized by the resonance frequency of the detecter 6; this auxiliary voltage 57 can be for example introduced momentarily into the system by pushing a suitable push-button 58 or any other suitable member such as an electromechanical relay.

Still another improvement of the present invention relates to the portion of the servocoupling loop above which comprises the integrator 23.

To increase the response speed of the device without reducing the accuracy of the measurements or the stability, there is mounted in parallel with this integrator 23 (FIG. 8), according to the present improvement, either a DC amplifier 59 (an apparatus of which the output voltage is proportional to the input voltage), or a differential amplifier 60, or these two apparatuses mounted in parallel one with the other, as illustrated.

This assembly avoids the servocoupling ensured by the loop concerned being too transient.

In addition it ensures great rapidity of response of this servocoupling to variations in the electrical parameter to be meansured and it rapidly restores at each moment to its compensating value the voltage $V_2$ formed by said loop.

In fact when the adjustment of the servocoupling is distant from its equilibrium value, the DC amplifier 59 supplies in very short time a considerable correction voltage and when the parameter to be measured varies suddenly, it is the differential amplifier 60 which supplies in very little time a considerable such correcting voltage: in both cases, the integrator alone would take a great deal of time to form comparable correcting voltages.

A result of which, and whatever the embodiment adapted, there is finally provided a device enabling measurement of quantities of electric charges, of voltages and of small electric currents with increased accuracy, a low time constant (in view of the relatively high frequencies employed), a great reliability and an almost infinite input impedance, limited only by phenomena of ionic conduction and by impurities of the medium in which the capacitor is placed, for example the ambiant air, and this without risk of interfering charges, and with a particularly simple and robust apparatus.

As is self evident, and as emerges already from the foregoing, the invention is in no way limited to those of its types of application and embodiments which have been more especially envisaged; it encompasses, on the contrary, all modifications, notably those where the electrical roles of the two electrodes 2 and 3 would be reversed, the fixed reference voltage being then applied to the movable electrode and the energising and compensating voltages, to the fixed electrode.

We claim:

1. Device for measuring an electrical parameter such as a quantity of electrical charges, or a quantity of another electrical parameter which is related to such a quantity of charges, present between two electrodes of which one is fixed and of which the other is mounted so as to be able to vibrate mechanically, said device comprising means for applying to one of the two electrodes an electrical reference voltage, energizing means for applying an alternating electrical voltage $V_0$ of frequency $f_0$ between the two electrodes; means for detecting the amplitude of the mechanical vibrations of frequency $f_0$ of the vibrating electrodes; and means for measuring said amplitude, which is a function of the parameter to be measured.

2. Measuring device according to claim 1, wherein the means for detecting and measuring the amplitude of the mechanical vibrations comprise respectively a piezo-electric element subject to these vibrations and an apparatus for measuring the alternating electrical voltage produced by this element.

3. Measuring device according to claim 2, wherein the mechanical resonance frequency of the assembly composed of the piezo-electric element and the vibrating electrode is equal to the frequency of the electrical energizing voltage.

4. Measuring device according to claim 1, wherein the means for detecting the amplitude of the mechanical vibrations comprises a capacitive sensor of the electrostatic capacitor type polarized by a direct current voltage 5. Measuring device according to claim 1, wherein the means for detecting the amplitude of the mechanical vibrations comprises an optical device for utilizing the variations in a parameter related to the geometry of a light beam reflected on a mirror connected mechanically to the vibrating electrode.

6. Measuring device according to claim 1 wherein the means for detecting the amplitude of the mechanical vibrations forms an electrical voltage whose amplitude is a function of said amplitude and whose frequency is equal to $f_0$, the means for measuring the amplitude comprise means for applying to the vibrating electrode an adjustable direct current electrical voltage formed from said electrical voltage so as to compensate for the electrical charge of this electrode and thus to compensate for its mechanical vibrations, means for detecting the instant of the latter compensation and means for measuring the value of said electrical voltage at said instant.

7. Measuring device according to claim 6 wherein the means for detecting the amplitude of the mechanical vibrations forms an electrical voltage whose amplitude is a function of said amplitude and whose frequency is equal to that of the energizing voltage, said means for measuring the amplitude comprising: a selective amplifier to which said electrical voltage is applied and having a band pass is centered at the frequency $f_0$; a synchronus detector for receiving, on the one hand, the output from this selective amplifier, and on the other hand, as a reference, the voltage $V_0$, said detector being associated with means adapted to dephase said voltage $V_0$ with respect to that received from the selective amplifier; and means for utilizing the output from said detector for the desired measurement purposes.

8. Measurement device according to claim 7, further comprising filter means for filtering the output of said selective amplifier, the means for utilizing the output from the detector comprising: a differential amplifier having one input is connected to the output of said filter means; an adjustable source of DC voltage connected to the second input of said amplifier; and means for utilizing the output from said amplifier for the desired measurement purposes.

9. Measuring device according to claim 8, wherein the means for utilizing the output from the differential amplifier comprise an integrator and means for using the output from said integrator for the desired measuring purposes.

10. Measuring device according to claim 9, wherein the means for utilizing the output from the integrator comprise: a second differential amplifier having one input connected to the output from the integrator; a source of adjustable DC voltage connected to the second input of said second amplifier and means for using the output from this second amplifier for the desired measurement purposes.

11. Measuring device according to claim 10, wherein an electrocal switch is connected between the output form the integrator and the corresponding input of the second amplifier.

12. Measuring device according to claim 7 wherein the means for utilizing the output from said detector comprise a further amplifier connected to said detector output and means for applying the output from said further amplifier to the vibrating electrode so as to provide a desired compensation for the electrical charge from said electrode.

13. Measuring device according to claim 12, further comprising means for utilizing the output from the further amplifier for the desired measuring purposes.

14. Measuring device according to claim 7, wherein the means for utilization of the detector output comprise a differentiator subjected to this output and means for using the output from this differentiator for the desired measuring purposes.

15. Measuring device according to claim 1 means further comprising for detecting the amplitude of the mechanical vibrations of frequencies $2f_0$ of the vibrating electrode; means for forming a DC electrical voltage $V_3$ whose amplitude is a function of this amplitude; and means for applying this voltage $V_3$ to the energizing means so as to modify the amplitude of the voltage $V_0$ in the sense which tends to make the amplitude of the abovesaid mechanical vibrations of frequency $f_0$ independant of the distance $d$ between the measuring electrode and the support.

16. Measuring device according to claim 15, wherein the means for forming the voltage $V_3$ comprise; means for forming an alternating electrical voltage $V_4$ of frequency $2f_0$ and of an amplitude which is a function of the amplitude of the mechanical vibrations of frequency $2f_0$ of the vibrating electrode; a selective amplifier, subjected to this voltage $V_4$, which has a band pass centered at the frequency $2f_0$ and is adapted to generate a voltage $V_5$; a frequency doubler subjected to a part of the voltage $V_0$ and adapted to deliver a voltage $V_6$ and a synchronous detector for receiving the two voltages $V_5$ and $V_6$ and being provided with means for dephasing this voltage $V_6$ with respect to the voltage $V_5$, the output $V_7$ from said synchronous detector constituting the voltage $V_3$.

17. Measuring device according to claim 16, wherein the means forming the voltage $V_3$ comprise in addition: a detector supplying a DC voltage $V_8$ of amplitude proportional to that of $V_0$; and a divider of which having two inputs supplied respectively by the two voltages $V_7$ and $V_8$, the output $V_9$ from this divider constituting the voltage $V_3$.

18. Measuring device according to claim 17, characterised in that the means for forming the voltage $V_{13}$, a differential amplifier having two inputs supplied respectively by the voltages $V_9$ and $V_{13}$ and providing a voltage $V_{14}$; and an integrator supplied by this voltage $V_{14}$, the output $V_{15}$ from this integrator constituting the voltage $V_3$.

19. Measuring device according to claim 15 wherein the means for applying the voltage $V_3$ to the energizing means comprise a multiplying amplifier having two inputs supplied respectively by an alternating electrical voltage $V'_0$ of frequency $f_0$ and by the voltage $V_3$, the output from this amplifier being the voltage $V_0$, which is applied between the two electrodes.

20. Measuring device according to claim 7 further comprising control means for making constantly equal to 0° the dephasing between the two voltages received by the synchronous detector.

21. Measuring device according to claim 20 wherein the control means comprise a synchronous detector, means for enabling the dephasing of the two voltages applied to the synchronous measuring detector with respect to one another, means for generating an alternating voltage of frequency at least equal to $f_0/5$, means for applying said alternating voltage to the control input of the dephasing device, and means for applying a part of said alternating voltage as a reference voltage to the synchronous correcting detector.

22. Measuring device according to claim 21, wherein the means for dephasing the two voltages applied to the synchronous detector with respect to one another provides correction of the frequency of the source of the energizing voltage $V_0$.

23. Measuring device according to claim 20, wherein the dephasing control means comprise a second synchronous detector phase shifted by 90° with respect to the first and adapted to form and error signal, and means for using this error signal for correction of the frequency of the source of the energizing voltage $V_0$.

24. Measuring device according to claim 9 further comprising a parallel combination of a DC amplifier and a differential amplifier connected in parallel with said integrator.

25. Measuring device according claim 15 further comprising means for moving the measuring electrode as a function of voltage $V_3$ so as to keep the distance $d$ substantially constant.

* * * * *